United States Patent [19]

Desu et al.

[11] Patent Number: 5,382,320

[45] Date of Patent: Jan. 17, 1995

[54] REACTIVE ION ETCHING OF LEAD ZIRCONATE TITANATE AND RUTHENIUM OXIDE THIN FILMS USING CHCLFCF₃ OR CHCL₂CF₃ AS AN ETCH GAS

[75] Inventors: Seshu B. Desu; Wei Pan, both of Blacksburg, Va.

[73] Assignees: CERAM Incorporated; Sharp Kabushiki Kaisha; Virginia Polytechnic Institute and State University

[21] Appl. No.: 96,171

[22] Filed: Jul. 22, 1993

Related U.S. Application Data

[63] Continuation-in-part of Ser. No. 75,059, Jun. 10, 1993.

[51] Int. Cl.⁶ .................................................. H01L 21/00
[52] U.S. Cl. ....................................... 156/667; 156/664; 156/643; 156/646

[58] Field of Search ................ 156/667, 664, 643, 646

[56] References Cited

U.S. PATENT DOCUMENTS

| | | | |
|---|---|---|---|
| 4,963,701 | 1/1989 | Takoahi et al. | 174/256 |
| 5,109,357 | 4/1992 | Eaton | 365/145 |
| 5,185,689 | 2/1993 | Maniar | 361/313 |
| 5,254,217 | 10/1993 | Maniar et al. | 156/656 |

Primary Examiner—R. Bruce Breneman
Assistant Examiner—George Goudreau
Attorney, Agent, or Firm—Beaton & Swanson

[57] ABSTRACT

A method of reactive ion etching both a lead zirconate titanate ferroelectric dielectric and a $RuO_2$ electrode, and a semiconductor device produced in accordance with such process. The dielectric and electrode are etched in an etching gas of $O_2$ mixed with either $CHCl_2CF_3$ or $CHClFCF_3$.

11 Claims, 6 Drawing Sheets

REACTIVE ION ETCHING OF LEAD ZIRCONATE TITANATE AND RUTHENIUM OXIDE THIN FILMS USING CHCLFCF₃ OR CHCL₂CF₃ AS AN ETCH GAS

This application is a continuation-in-part of application No. 08/075,059 filed Jun. 10, 1993 pending for Reactive Ion Etching of Lead Zirconate Titanate and Ruthenium Oxide Thin Films.

FIELD OF THE INVENTION

The present invention relates to the field of producing a pattern on semiconductor devices and, in particular, to a method and system for reactive ion etching of lead zirconate-titanate ("PZT") and ruthenium oxide ("$RuO_2$") thin films used in semiconductor devices such as a dynamic random access memory, using $CHClFCF_3$ or $CHCl_2CF_3$ with $O_2$ as an etch gas.

BACKGROUND OF THE INVENTION

Semiconductor devices such as a dynamic and nonvolatile random access memory ("DRAM") have decreased in size and increased in capacity dramatically over the last 20 years. As the capacity of memory cells has increased and the size has decreased, the design of the cells has become increasingly complex in order to preserve sufficient electrical capacitance to hold the electrical charge representing the stored data.

In the past silicon dioxide has been used as the dielectric in the capacitors of DRAM cells. However, silicon dioxide has a relatively low dielectric constant of about four. There has recently been experimentation with the use of other dielectric materials in order to increase the electrical capacitance in very small and complex cells. Some of this work has focused on the use of ferroelectric materials such as PZT as the dielectric in the capacitor. The relaxation properties of the PZT ferroelectric material produce an increase in the capacitance that is beyond what the dielectric constant would indicate. An example of such an approach is described in U.S. Pat. No. 5,109,357 by Eaton. Desirable materials for the electrodes associated with PZT capacitors include $RuO_2$, Pt and ITO. $RuO_2$ is especially desirable due to its high chemical stability, high electrical conductivity and its reduction of fatigue of PZT films. See, C. K. Kwok, D. P. Vijay and S. B. Desu, *Proceedings of the 4th International Symposium on Integrated Ferroelectrics*, Monterey, California (1992).

Regardless of the material used as the dielectric in the capacitor of a DRAM, the cell surface must be patterned in some manner to produce the desired capacitor configuration. As mentioned, some of these capacitor configurations must be quite complex to achieve the necessary capacitance. PZT films have been patterned by laser-induced sputtering (see, M. Eyett, D. Bauerie, W. Wersing and H. Thomann, J. Appl. Phys. (62, 1511 (1987)), chemical wet etching (see, H. T. Chung and H. G. Kim, Ferroelectrics, 76 (1987)), ion milling and reactive ion etching (RIE). Preferably, the patterning technology can be performed at a rapid rate, produces a high resolution so that it can be used in complex capacitor configurations, and is highly uniform. RIE is particularly suitable because it produces a high etch rate at low etching power, high selectivity and good anisotropic profiles by appropriate selection of the reactive gas.

In ordinary RIE, material is selectively removed by an interaction with chemically reactive ion species created by a radio frequency ("RF") glow discharge maintained in the etching chamber. RIE normally involves covering the surface to be etched with a mask which leaves exposed the selected areas to be etched. The substrate is then placed into a chamber containing a chemically reactive gas such as $CF_4$ mixed with $O_2$. A plasma is produced by applying an RF potential across the gas to dissociate and form various species including positive and negative ions, reactive atoms such as fluorine, and radicals. This plasma reacts with the unmasked and exposed surface of the material to be etched to form volatile products which are removed to leave an etched profile.

One of the barriers to widespread use of PZT ferroelectrics as a dielectric in DRAM capacitors is the difficulty of etching such materials and their associate electrodes in an effective and efficient manner. The difficulty is compounded by the difficulty of identifying a suitable etch gas that can etch all three components of the PZT solid solution (PbO, $ZrO_2$ and $Ti_1O_2$) at an acceptable rate, and identifying a common etch gas for both the $RuO_2$ electrode or other electrode and the PZT ferroelectric material which will allow for stacked capacitor etching. Plasma etching of PZT thin films in $CF_4$ and HCl plasmas has been reported in M. R. Poor, A. M. Hurt, C. B. Fledermann and A. U. Wu, *Mat. Res. Soc. Symp. Proc.*, 200 (1990). However, to obtain high etch rates, substrate heating was necessary in their process. RIE of $RuO_2$ with a $CF_4/O_2$ plasma has been reported in S. Saito and K. Kuramasu, Jpn. J. Appl. Phys. 31, 135 (1993). The use of $CF_4+O_2$ has been reported in RIE of $RuO_2$ (see, S. Saito and K. Kuramusa, Jpn. J. Appl. Phys. 31, 135 (1992)) and the use of $CCl_4$ has been reported in RIE of PZT (sese, S. Saito, et al., Jpn. J. Appl, Phys. 31, L1260 (1992)). $CCl_2F_2$ with $O_2$ has been used to etch both $RuO_2$ and PZT films, but $CCl_2F_2$ is believed to be environmentally damaging. Therefore, there is a need for an environmentally safe etching gas to use in RIE of $RuO_2$ and PZT films.

DETAILED DESCRIPTION OF THE INVENTION

PZT films can be deposited on a Pt/Ti/SiO₂/Si substrate by metalorganic decomposition (MOD) in accordance with methods known in the art. See, for example, G. Yi and M. Sayer, Ceram Bulls 70(7), 1173 (1991). In a preferred embodiment of the present invention, the PZT precursor is a metalorganic solution (0.5M) of lead acetate, zirconium n-propoxide and titanium iso-propoxide dissolved in n-propanol. The solution is spin coated on the substrate at 2000 rpm for 40 seconds and subsequently dried at 130° C. for 3 minutes. This spin-bake cycle was repeated until the desired thickness of 2000Å was obtained. The coated PZT films were annealed at 650° C. for 30 minutes to form the perovskite phase. Similarly, $RuO_2$ films with thickness of 2000Å can be reactively sputtered onto a $SiO_2$/Si substrate in an argon-oxygen atmosphere at a gas pressure of 10 mTorr and a substrate temperature of 200° C. The films are subsequently annealed at 600° C. for 30 minutes in air to form stoichiometric composition and to relieve the stress.

Positive photoresist patterns (Shipley 1350J, 1.5 μm) are used as etching masks for PZT and $RuO_2$ samples. These patterns can be removed by organic solvent after etching and etched steps were left on the sample surfaces. The step heights can be measured by a WYKO 3D surface profile meter. The etch rates can be determined by dividing the step heights by etching time. Meanwhile, the etch endpoint can also be observed directly.

Figure 1:
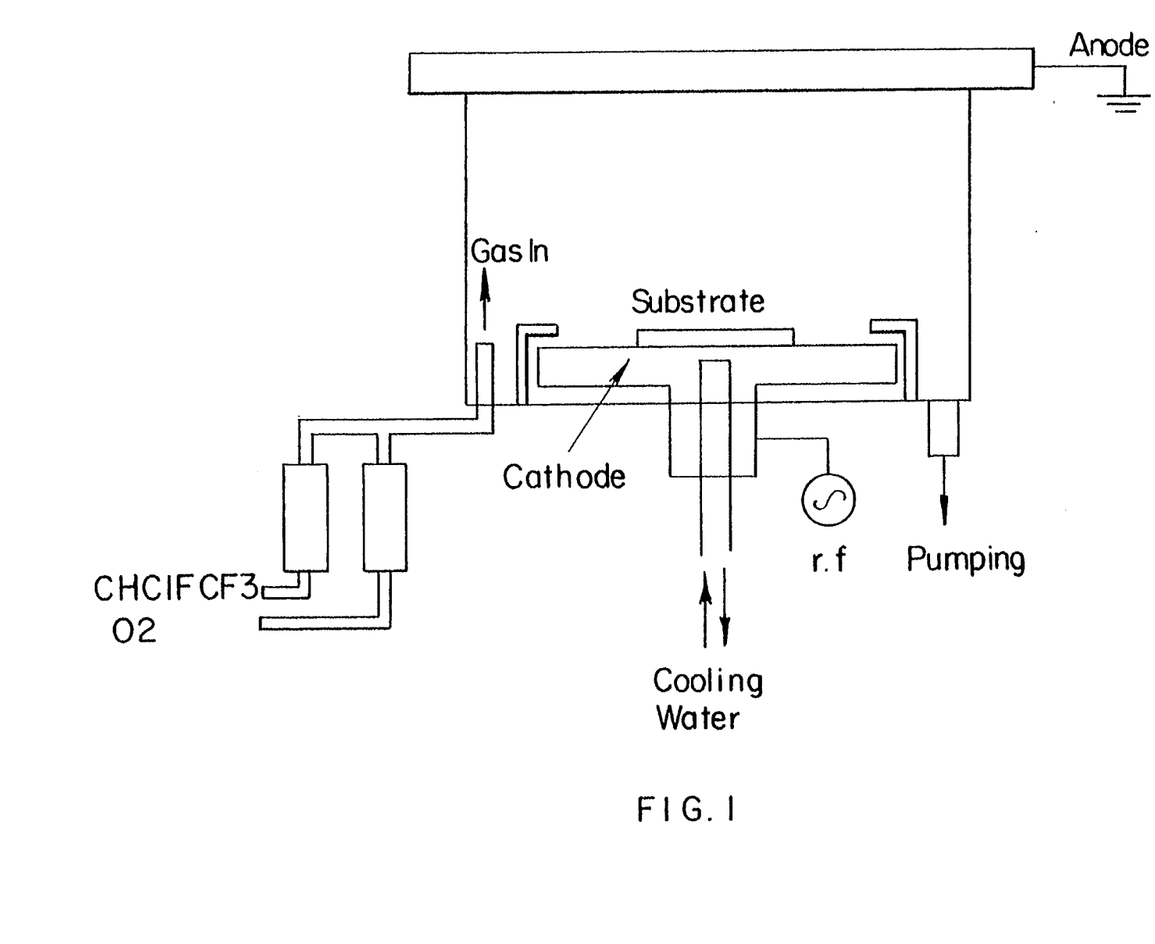
FIG. 1 is a schematic diagram showing an apparatus for practicing the present invention.

The RIE system for PZT and $RuO_2$ etching may be one of those known in the art such as a SAMCO RIE-1C rf diode compact etcher with electrode separation of 5 cm and cathode area of 113 $cm^2$, which is shown schematically in FIG. 1. Both the cathode and etching samples are water cooled during the etching process.

Since the PZT solid solution consists of three components (PbO, $ZrO_2$ and $TiO_2$), the overall etch rate is dependent on the Zr/Ti ratio and the concentration of excess lead. This is because of the differing volatilities of the fluorides and chlorides of the constituent elements. Only the etch characteristics of PZT films with compositions close to the morphotrophic phase boundary were examined in the present invention. No substrate heating was used to avoid the loss of the lead from the masked areas which could result in degradation of the films at high temperatures. The etching was performed on water cooled substrate holders to avoid excessive heating from the plasma. The critical etch parameters studied were the gas pressure, RF power and the effect of $O_2$ addition to the $CHClFCF_3$ or $CHCl_2CF_3$ plasma. Since the objective is to etch the complete ferroelectric stack capacitor in a single run, the etch rate of $RuO_2$ was also studied under the same conditions as the PZT films. The range of the values of the parameters were chosen so as to observe the general trends in etching of these films with varying conditions. The parameter values were also limited by the stability of the plasma.

Figure 2:
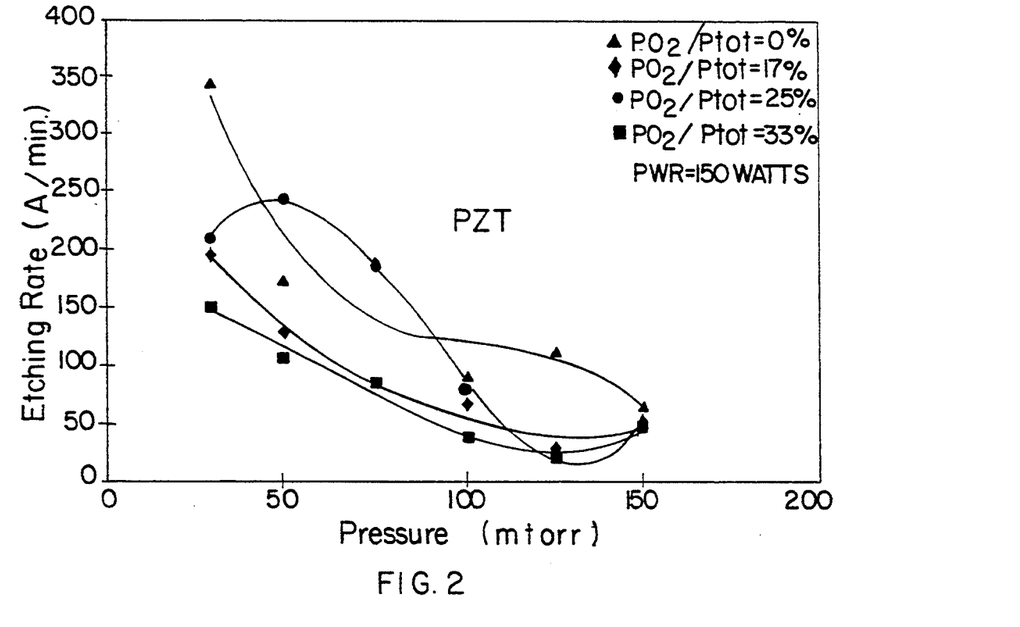
FIG. 2 is a graph of etch rate on PZT versus etch gas pressure.

FIG. 2 shows the effect of $O_2$ addition on the etch rate of PZT films at various gas pressures. In general, there is a peak in the etch rate with varying $O_2$ content at a particular gas pressure. At low gas pressures, it was found that the etch rate dropped significantly with increasing $O_2$ content in the chamber. The addition of $O_2$ in small amounts is known to enhance the etch rate in the case of $SiO_2$ etching, and so one might expect a mechanism of etching similar to that of $SiO_2$ in the present process. At lower gas pressures, it was found that the addition of small amounts of $O_2$ does enhance the etch rate of the PZT films, possibly by causing reduction in the recombination of the radicals. However, at higher $O_2$ content, the etch gas is diluted and therefore the etch rate is reduced. Addition of $O_2$ to the etch gas at high gas pressures tends to reduce the number of radicals participating in the etch process near the sheath region. The effective impact energy of the ions participating in the sputtering is therefore increased as a result of reduced collisions.

Figure 2A:
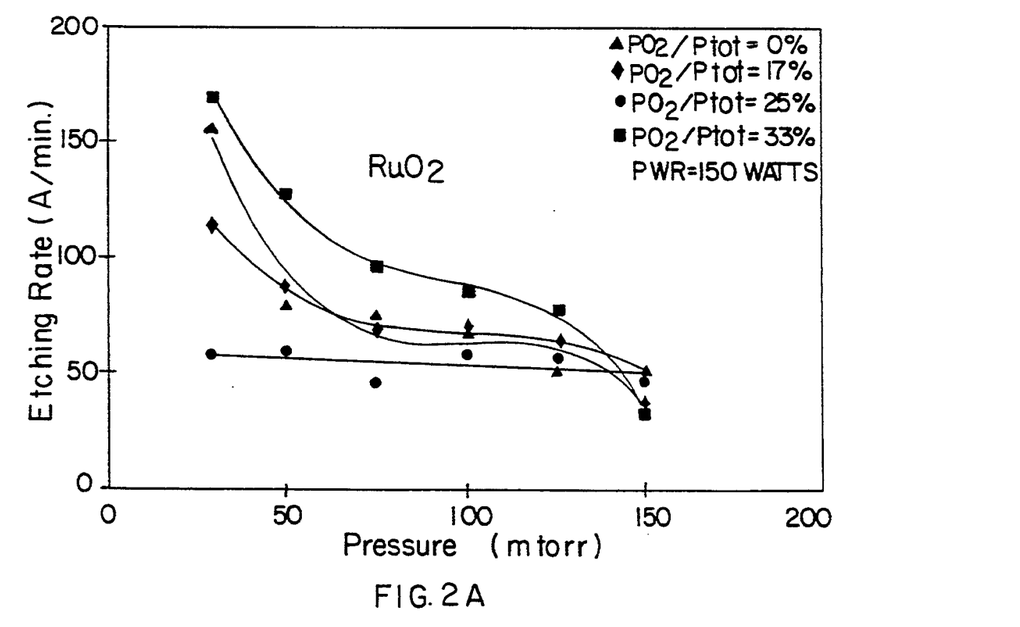
FIG. 2A is a graph of etch rate of $RuO_2$ versus etching gas pressure.
Figure 2B:
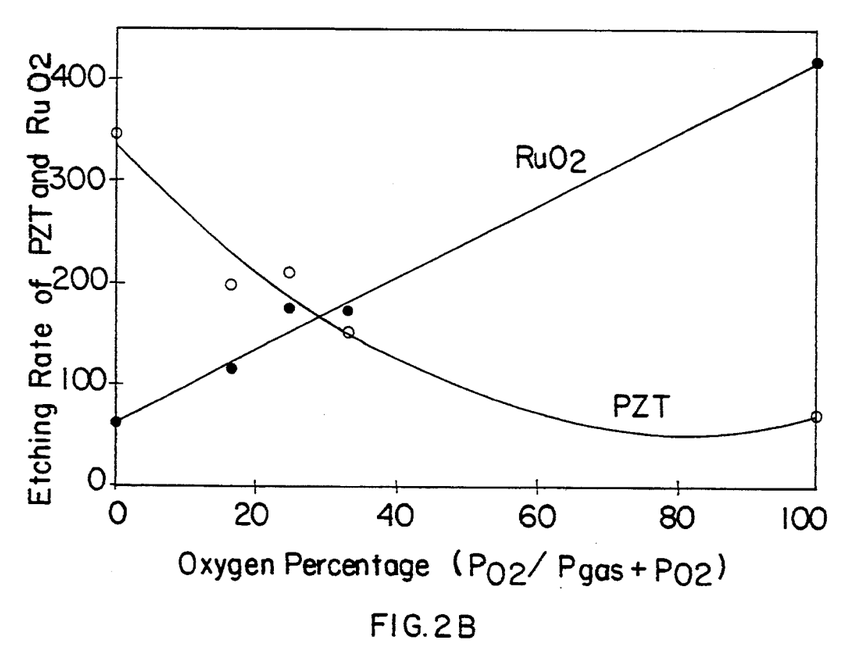
FIG. 2B is a graph showing the etch rate of PZT and $RuO_2$ films as a function of oxygen percentage.

FIG. 2A shows the increase in etch rates of $RuO_2$ films with increasing oxygen concentration. It is noted that the highest etching rate was obtained under pure oxygen plasma. In the case of RIE of $RuO_2$ films, $O^*$ might play a vital role. According to Saito, et al., supra, $RuO_4$ and $RuF_5$ have been identified as volatile by-products during the RIE of $RuO_2$. In addition, $RuO_4$ has relatively lower boiling point (40° C.) and consequently higher vapor pressure compared to $RuF_5$. Therefore, $O^*$ radical may have higher degree of reactivity compared to $Cl^*$ and $F^*$ react with $RuO_2$ to form the volatile substance $RuO_4$ in RIE of $RuO_2$. Since the addition of oxygen affected the RIE rates of PZT and $RuO_2$ films in a different way, selective etching of PZT on $RuO_2$ electrodes was feasible. FIG. 2B shows the large etch rate ratio (ERR) of PZT and $RuO_2$ films obtained by controlling the oxygen percentage.

The etch anisotropy and etched surface morphology under various etching conditions was studied using SEM. Under the conditions of lower gas pressure and lower etching power the etched step tended to be more anisotropic. The etched surface, however, showed more smooth with the increasing of oxygen percentage and decreasing of the etching power.

Figure 3:
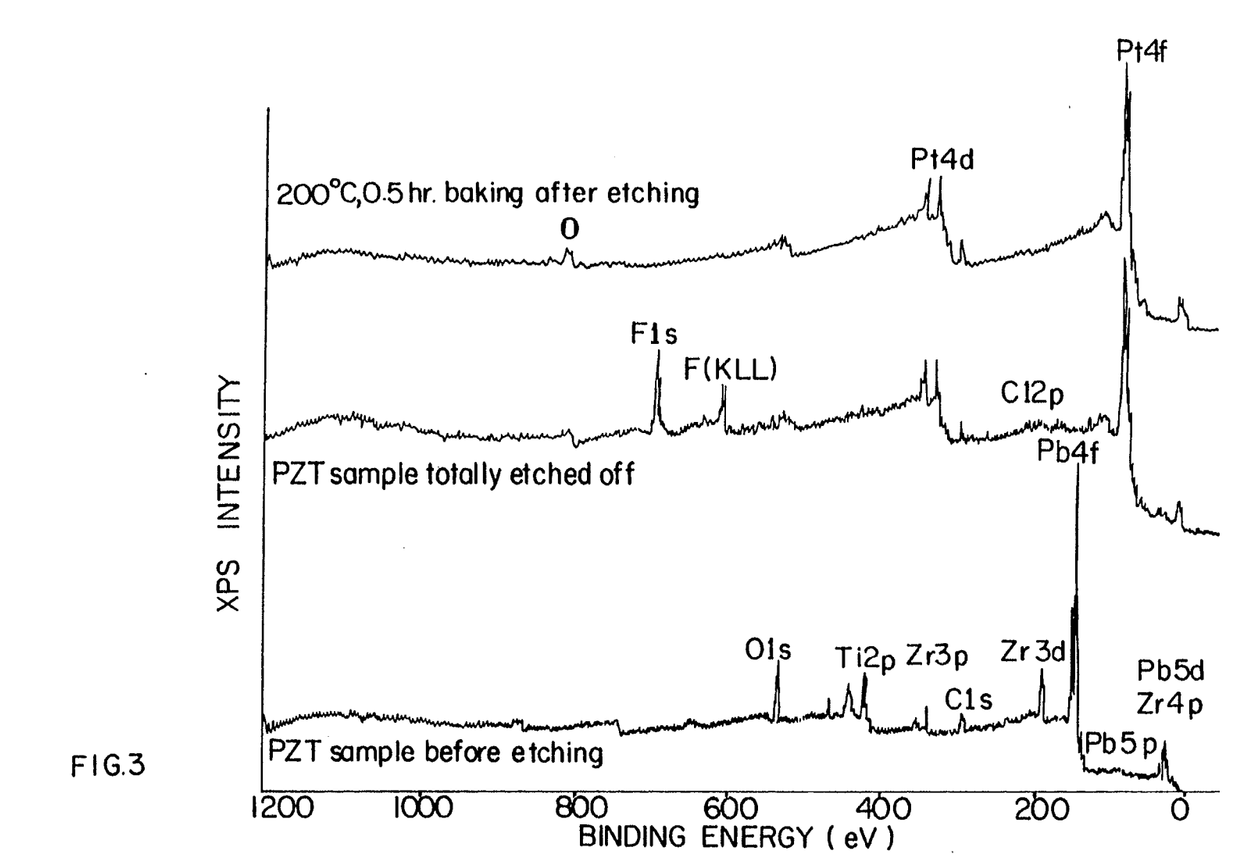
FIG. 3 is a comparison of an ESCA wide scan before, during and after the etch process of the present invention on PZT.
Figure 4:
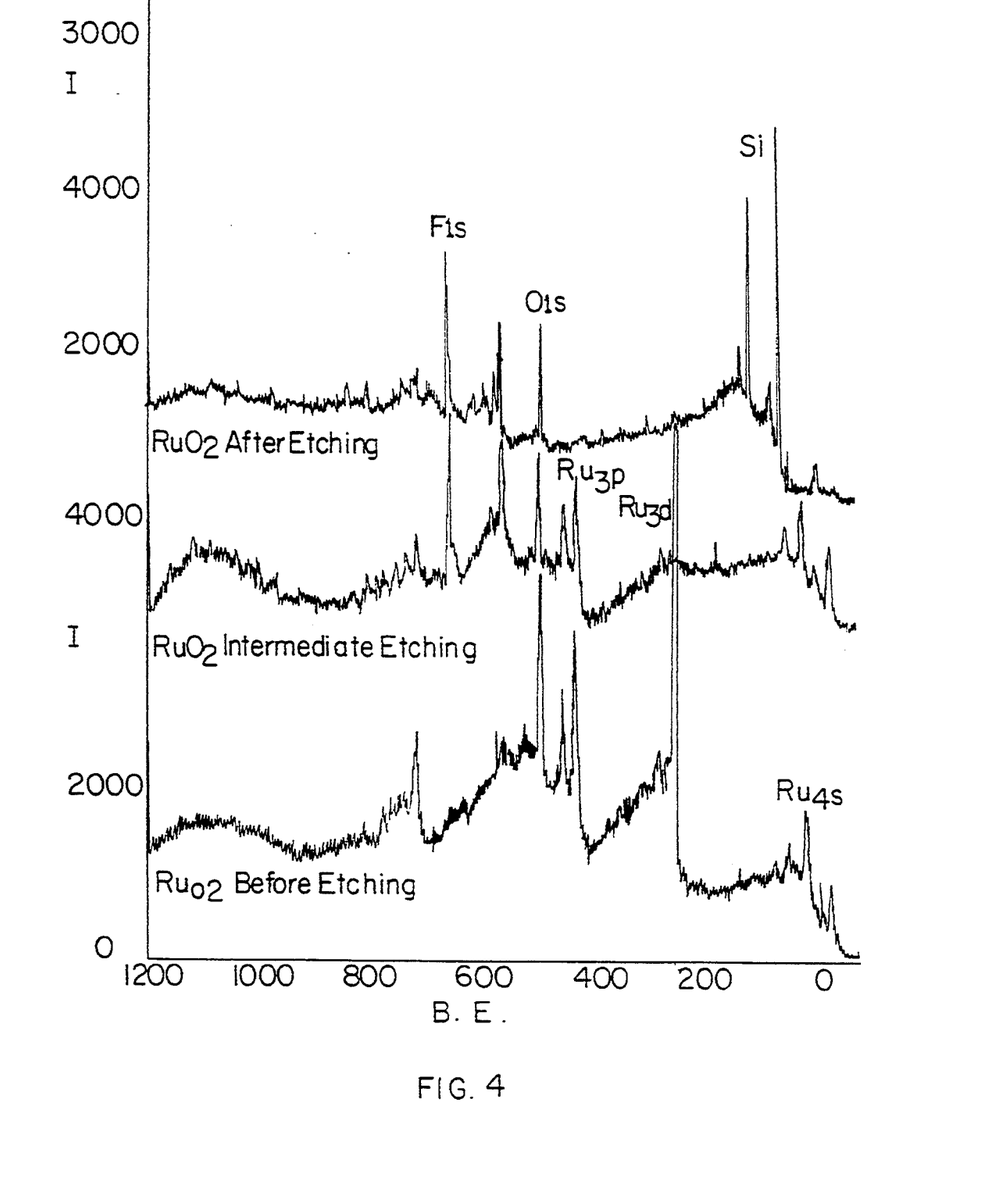
FIG. 4 is a comparison of an ESCA wide scan before, during and after the etch process of the present invention on $RuO_2$.

The composition of the etched surface can be determined as a function of etch time using x-ray photoelectron spectroscopy ("XPS"). For this study, the etching is performed on a single sample (1 cm×1 cm) without any overlying mask. An initial surface analysis is performed on the sample before the etching process and subsequent analyses are done at predetermined intervals during etching. FIG. 3 is a comparison of the ESCA wide scan before, during and after the etch process for PZT etching in accordance with the present invention, and FIG. 4 is a comparison of the ESCA wide scan before, during and after the etch process for $RuO_2$ etching in accordance with the present invention. The components of the PZT solid solution clearly seem to be completely etched out at the end of the etch process. However, at the end of this process, Cl and F residues are present on the surface of the sample. These residues were removed easily by baking the sample at 100° C. for 30 minutes.

Figure 5:
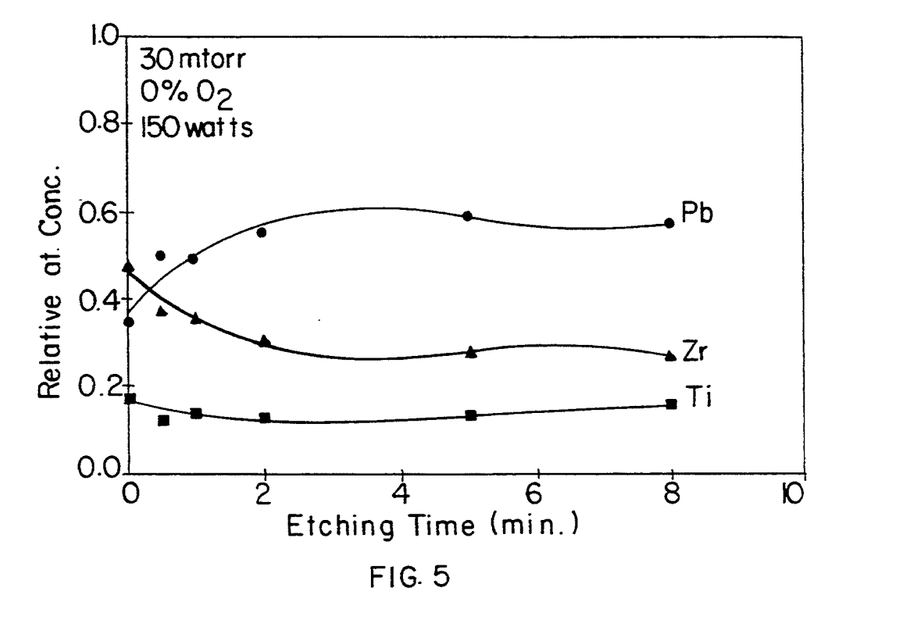
FIG. 5 is a graph of the relative atomic concentration of Pb, Zr and Ti as a function of etch time for etching in accordance with the present invention.

FIG. 5 is a plot of the relative atomic concentration of Pb, Zr and Ti as a function of etch time. The concentrations of these elements were determined using the standard-less ratio method (more details regarding this method can be obtained from S. B. Desu and C. K. Kwok, Mat. Res. Soc. Symp. Proc., 200, 267 (1990)). This plot is a clear indication of the relative etch rates of the three components in the PZT solid solution. Initially, the relative atomic concentration of Zr and Ti decreases quite rapidly. The narrow scan results show that after the first 30 seconds of etching under these conditions, there is a continuous decrease in the Zr concentration while the relative Ti concentration appears to be nearly constant. It is evident from FIG. 5 that the etch rate of PbO is the limiting factor in the etching of PZT thin films and therefore any post-etch residues are primarily due to PbO.

The chlorides of Zr, Ti and Pb have higher vapor pressures compared to the corresponding fluorides at the etching temperature ($\sim 100°$ C.) and therefore it is expected that the primary volatile by-products will consist of the chlorides. However, the actual presence of these compounds in the by-products was not identified experimentally. The vapor pressure of the chlorides decreases in the order of $TiCl_4 > ZrCl_4 > PbCl_2$.

Figure 6:
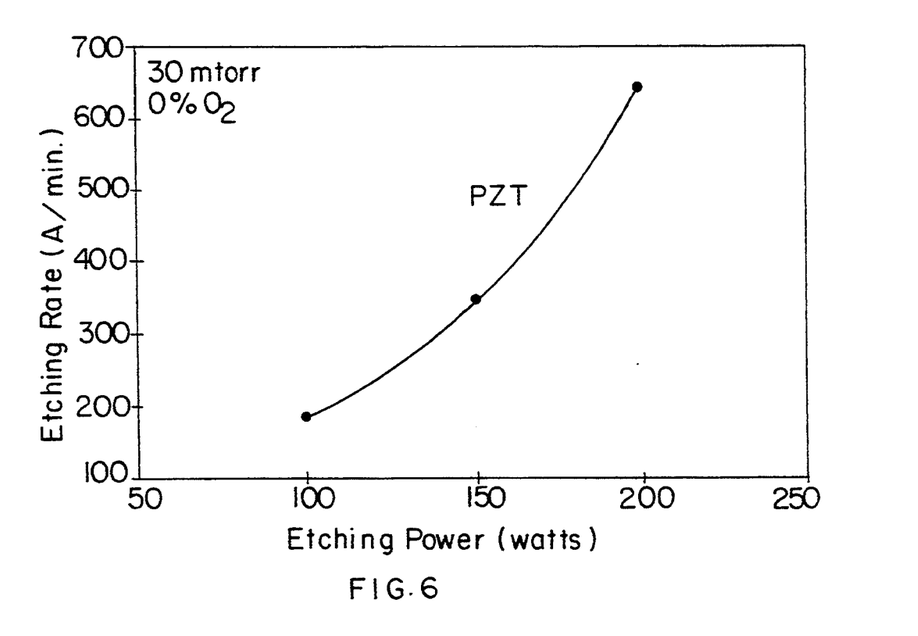
FIG. 6 is a graph of etch rate of PZT versus RF power.

The effect of RF power on the etch rate of PZT films is shown in FIG. 6. In general, the etch rate increased with increasing RF power. It is well known that with an increase in the RF power, the sheath potential and the concentration of the reactive ions increase. The effect of gas pressure on the etch rate at different power values does suggest that the increase in etch rate with RF power is due to the increase in sheath potential.

What is claimed is:

1. A method of reactive ion etching a material that includes at least one of $RuO_2$ and lead zirconate titanate, comprising: placing the material into a chamber, the chamber containing at least one of $CHCl_2CF_3$ and $CHClFCF_3$, and producing a glow discharge in the chamber to etch the material.

2. The method of claim 1, wherein the material includes both $RuO_2$ and lead zirconate titanate.

3. The method of claim 2, wherein the glow discharge is produced by radio frequency.

4. The method of claim 3, wherein the radio frequency power is between 125 and 200 watts.

5. The method of claim 1, wherein the chamber includes $O_2$.

6. The method of claim 5, wherein the $O_2$ content in the chamber is between 10% and 50% of the total gas content in the chamber.

7. The method of claim 5, wherein the gas pressure in the chamber is less than about 175 mTorr.

8. A method of patterning a semiconductor device that includes at least one of $RuO_2$ and lead zirconate titanate, comprising: applying a mask over the material which covers a portion of the material and leaves exposes another portion of the material, placing the material with the applied mask into a chamber including at least one of $CHCl_2CF_3$ and $CHClFCF_3$, and producing a glow discharge in the chamber to reactively ion etch the exposed portion of the material.

9. The method of claim 8, wherein the device includes both lead zirconate titanate and $RuO_2$, and the lead zirconate titanate functions as a dielectric and the $RuO_2$ functions as an electrode.

10. The method of claim 8, wherein the glow discharge is produced by radio frequency.

11. A semiconductor device, produced in accordance with the process of: applying at least one of lead zirconate titanate and $RuSO_2$ to a substrate, placing said substrate into a chamber, and reactive ion etching the at least one of said lead zirconate titanate and $RuO_2$ in an etching gas containing $O_2$ and at least one of $CHCl_2CF_3$ and $CHClFCF_3$.

* * * * *

UNITED STATES PATENT AND TRADEMARK OFFICE
CERTIFICATE OF CORRECTION

PATENT NO. : 5,382,320
DATED : Jan. 17, 1995
INVENTOR(S) : Desu, et al.

It is certified that error appears in the above-indentified patent and that said Letters Patent is hereby corrected as shown below:

In Column 2, Line 22, change: "$Ti_1O_2$" to --$TiO_2$--.

In Column 2, Line 36, change: "sese" to --see--.

In Column 4, Lines 30 & 31, change: "showed more smooth" to --is smoother--.

In Claim 8, Column 6, Line 12, change: "exposes" to --exposed--.

In Claim 11, Column 6, Line 25, change: "$RuSO_2$" to --$RuO_2$--.

In Claim 11, Column 6, Lines 26 & 27, change: "the at least one of" to --at least one of the--.

Signed and Sealed this

Seventh Day of November, 1995

Attest:

BRUCE LEHMAN

Attesting Officer

Commissioner of Patents and Trademarks